United States Patent
Shinagawa et al.

(10) Patent No.: US 10,641,807 B2
(45) Date of Patent: May 5, 2020

(54) OPTICAL MODULATOR AND ELECTRIC FIELD SENSOR (71) Applicants: JX Nippon Mining & Metals Corporation, Tokyo (JP); Mitsuru Shinagawa, Tokyo (JP)

(72) Inventors: Mitsuru Shinagawa, Tokyo (JP); Toshiaki Asahi, Tokyo (JP)

(73) Assignees: JX NIPPON MINING & METALS CORPORATION, Tokyo (JP); Mitsuru Shinagawa, Tokyo (JP)

( * ) Notice: Subject to any disclaimer, the term of this patent is extended or adjusted under 35 U.S.C. 154(b) by 116 days.

(21) Appl. No.: 15/753,585

(22) PCT Filed: Oct. 7, 2016

(86) PCT No.: PCT/JP2016/079922
§ 371 (c)(1),
(2) Date: Feb. 20, 2018

(87) PCT Pub. No.: WO2017/065104
PCT Pub. Date: Apr. 20, 2017

(65) Prior Publication Data
US 2018/0238949 A1   Aug. 23, 2018

(30) Foreign Application Priority Data
Oct. 16, 2015   (JP) .................. 2015-204452

(51) Int. Cl.
*G01R 29/08* (2006.01)
*G01R 15/24* (2006.01)
(Continued)

(52) U.S. Cl.
CPC ......... *G01R 29/0885* (2013.01); *G01R 1/071* (2013.01); *G01R 15/242* (2013.01);
(Continued)

(58) Field of Classification Search
CPC ............... G01R 29/0885; G01R 1/071; G01R 15/241–242; G02B 27/0977–0983; H01L 31/02327; H01S 3/0064
(Continued)

(56) References Cited

U.S. PATENT DOCUMENTS 3,663,090 A * 5/1972 Miller .................. G02F 1/29
359/301
3,930,718 A    1/1976 Jensen
(Continued)

FOREIGN PATENT DOCUMENTS

CN    103163051 A    6/2013
CN    104655943 A    5/2015
(Continued)

OTHER PUBLICATIONS

A. Sasaki et al., "Study of Semiconductor Electro-Optic Modulators for Sensing Extremely-Low-Frequency Electrical Signals", Sensors and Actuators A: Physical, vol. 151, No. 1, pp. 1-8, Feb. 2009.
(Continued)

*Primary Examiner* — Patrick Assouad
*Assistant Examiner* — Demetrius R Pretlow
(74) *Attorney, Agent, or Firm* — Howson & Howson LLP (57) ABSTRACT In an optical modulator capable of modulating incident laser beam L by a compound semiconductor single crystal having a property of generating an electro-optic effect, the attenuation of the signal strength in a low frequency band is prevented without lowering the carrier concentration of the compound semiconductor.

The optical modulator 23 comprises: incidence limiting means 25 which is provided on or near an incidence plane 24a, on which the laser beam L can be incident, of the compound semiconductor single crystal 24 so as to limit incidence of light other than the laser beam L on the
(Continued)

incidence plane 24a; and a shielding member 26 which is formed from a low-permittivity material having a light blocking effect, and covers a surface 24c of the compound semiconductor single crystal 24 extending along a traveling direction of the laser beam L that entered the compound semiconductor single crystal 24.

12 Claims, 6 Drawing Sheets

(51) Int. Cl.
    *G01R 1/07*     (2006.01)
    *G02B 27/09*     (2006.01)
    *H01L 31/0232*     (2014.01)
    *H01S 3/00*     (2006.01)

(52) U.S. Cl.
    CPC .... *G02B 27/0977* (2013.01); *H01L 31/02327* (2013.01); *H01S 3/0064* (2013.01)

(58) Field of Classification Search
    USPC .................................................... 324/96–97
    See application file for complete search history.

(56) References Cited

U.S. PATENT DOCUMENTS

| | | | | |
|---|---|---|---|---|
| 4,327,971 | A * | 5/1982 | Kondo | G02F 1/035 359/250 |
| 4,336,982 | A * | 6/1982 | Rector, Jr. | G02F 1/11 359/285 |
| 4,583,825 | A | 4/1986 | Buzak | |
| 4,794,033 | A * | 12/1988 | Ooi | G02B 1/115 359/578 |
| 4,842,396 | A * | 6/1989 | Minoura | B41J 2/465 348/770 |
| 4,968,881 | A * | 11/1990 | Takahashi | G01R 15/242 250/231.1 |
| 4,982,151 | A * | 1/1991 | Takahashi | G01R 1/071 250/225 |
| 5,189,547 | A * | 2/1993 | Day | G02F 1/0327 310/320 |
| 5,210,407 | A * | 5/1993 | Ito | G01R 29/0885 250/227.11 |
| 5,278,499 | A * | 1/1994 | Ito | G01R 33/032 250/227.14 |
| 5,434,698 | A * | 7/1995 | Takano | G01R 1/071 257/451 |
| 5,500,587 | A * | 3/1996 | Takahashi | G01R 1/071 324/754.06 |
| 5,592,101 | A | 1/1997 | Takahashi et al. | |
| 5,621,744 | A * | 4/1997 | Kikuchi | G02F 1/37 372/12 |
| 6,466,375 | B1 | 10/2002 | Kanaya | |
| 6,573,699 | B1 * | 6/2003 | Hama | G01R 1/071 324/73.1 |
| 8,814,365 | B2 | 8/2014 | Iwane et al. | |
| 2002/0167974 | A1 * | 11/2002 | Kennedy | H01S 3/2232 372/10 |
| 2004/0228565 | A1 * | 11/2004 | Sato | G02F 1/035 385/3 |
| 2005/0244166 | A1 * | 11/2005 | Shinagawa | G06F 1/163 398/186 |
| 2006/0007966 | A1 * | 1/2006 | Laughman | G02F 1/0305 372/12 |
| 2006/0051019 | A1 * | 3/2006 | Sasaki | G02F 1/0316 385/31 |
| 2007/0120563 | A1 * | 5/2007 | Kawabata | G01R 33/0354 324/244.1 |
| 2008/0013157 | A1 * | 1/2008 | Ishii | G02B 1/118 359/298 |
| 2010/0264904 | A1 * | 10/2010 | Wu | G01R 29/0885 324/97 |
| 2011/0164302 | A1 * | 7/2011 | Quetschke | G02F 1/03 359/251 |
| 2011/0188798 | A1 * | 8/2011 | Yafuso | G02F 1/035 385/2 |
| 2013/0064259 | A1 * | 3/2013 | Wakabayashi | H01S 3/08027 372/38.1 |
| 2013/0170785 | A1 * | 7/2013 | Gao | G02F 1/093 385/8 |
| 2015/0130983 | A1 * | 5/2015 | Yamaguchi | G02B 5/3058 348/333.09 |
| 2016/0334652 | A1 * | 11/2016 | Sakuma | H01S 3/2391 |
| 2017/0343792 | A1 * | 11/2017 | Matsunobu | G02B 27/1006 |

FOREIGN PATENT DOCUMENTS

| | | |
|---|---|---|
| JP | S60-244865 A | 12/1985 |
| JP | H05-5755 A | 1/1993 |
| JP | H06-88840 A | 3/1994 |
| JP | H08-146051 A | 6/1996 |
| JP | 2005-214892 A | 8/2005 |
| JP | 2010-230594 A | 10/2010 |
| WO | 2015/149473 A1 | 10/2015 |

OTHER PUBLICATIONS

European Search Report dated Jan. 7, 2019 for corresponding European Patent Application No. 16855358.4.

* cited by examiner

OPTICAL MODULATOR AND ELECTRIC FIELD SENSOR

BACKGROUND

The present invention relates to an optical modulator using a compound semiconductor single crystal which generates an electro-optic effect, and an electric field sensor using the optical modulator.

Some of compound semiconductor single crystals; for example, zinc telluride (ZnTe) and gallium arsenide (GaAs); exhibit a so-called electro-optical (EO) effect in which the refractive index changes by the action of electric field. Such a compound semiconductor single crystal (hereinafter referred to as the "electro-optic crystal") has been used for an optical modulator and other various optical devices.

Conventionally, most of these optical devices were compliant with electromagnetic waves of a high frequency exceeding 1 THz, but in recent years, research for those which are compliant with electromagnetic waves of a low frequency of 100 kHz or less is being conducted (refer to Non-Patent Document 1).

CITATION LIST

Non-Patent Documents

[Non-Patent Document 1] A. Sasaki, A. Furuya, and M. Shinagawa, "Study of semiconductor electro-optic modulators for sensing extremely-low-frequency electrical signals", Sensors and Actuators A: Physical, Vol. 151, No. 1, pp. 1-8, 2009.

SUMMARY

As a result of research, it has been discovered that the foregoing electro-optic crystal is unable to exhibit sufficient EO effect particularly against electromagnetic waves of a low frequency of 10 kHz or less; that is, it is not possible to accurately detect low frequency electromagnetic waves with a sensor that is configured using this electro-optic crystal. The cause of this is considered to be because the electrons or holes (hereinafter referred to as the "carriers") in an electro-optic crystal migrate so as to negate the electric field bound to the electro-optic crystal. In particular, in a low frequency band in which the migration of carriers can follow changes in the electric field, the electro-optic effect will be lost and the electric field can no longer be detected.

Considered as a method of preventing the foregoing problem is, for instance, a method of adding a donor impurity (in the case of ZnTe, indium (In), gallium (Ga) or the like) to the electro-optic crystal, and thereby reducing the carrier concentration in the electro-optic crystal (increasing the resistance of the crystal). When this kind of method is used, the electro-optic crystal can exhibit a high EO effect even against low frequency electromagnetic waves.

Nevertheless, depending on the usage environment, there are cases where outside light such as illumination light enters the electro-optic crystal and generates carriers in the electro-optic crystal, such carriers move to negate the electric field bound to the electro-optic crystal, and thus sufficient effects still could not be obtained.

The present invention was devised in light of the foregoing problems, and an object of this invention is to reduce the outside light that enters a compound semiconductor single crystal in an optical modulator using a compound semiconductor single crystal which generates an electro-optic effect.

In order to achieve the foregoing object, one invention claimed in the present application is an optical modulator capable of modulating incident laser beam by a compound semiconductor single crystal having a property of generating an electro-optic effect, the optical modulator comprising: incidence limiting means which is provided on or near an incidence plane, on which the laser beam can be incident, of the compound semiconductor single crystal so as to limit incidence of light other than the laser beam on the incidence plane; and a shielding member which is formed from a low-permittivity material having a light blocking effect, and covers a surface of the compound semiconductor single crystal that extends along a traveling direction of the laser beam that entered the compound semiconductor single crystal.

Note that, in the foregoing invention, the incidence limiting means may be a dichroic mirror, which is configured to permit the passage of only light of the same wavelength as the laser beam, and is attached to the incidence plane.

Moreover, in the foregoing invention, the incidence limiting means may be a shielding plate in which a pinhole penetrating in a thickness direction and having a diameter substantially equal to a width of the laser beam is formed, and which is attached to the incidence plane.

Moreover, in the foregoing invention, the incidence limiting means may be configured such that the shielding member extends beyond the incidence plane in a direction from which the laser beam enters.

Moreover, in the foregoing invention, an antireflection film which prevents the laser beam from reflecting off the incidence plane may be formed between the incidence plane and the incidence limiting means.

Moreover, another invention claimed in the present application is an electric field sensor comprising: the optical modulator according to the foregoing invention; a light source to cause a laser beam to be incident on the incidence plane; and conversion means to convert changes in polarization of the laser beam that passed through the optical modulator, into an electric signal.

According to the present invention, it is possible to reduce the outside light that enters a compound semiconductor single crystal in an optical modulator using a compound semiconductor single crystal which generates an electro-optic effect.

It is thereby possible to suppress the generation of carriers in the compound semiconductor single crystal, and prevent the deterioration of the electric field detection sensitivity in a low frequency band.

DETAILED DESCRIPTION

First Embodiment

The first embodiment of the present invention is now explained with reference to FIG. 1 and FIG. 2.
(Configuration of Electric Field Sensor and Optical Modulator)

The schematic configuration of the electric field sensor according to this embodiment and the specific configuration of the optical modulator comprised in the electric field sensor are foremost explained. FIG. 1 is a block diagram showing a schematic configuration of the electric field sensor 1 according to this embodiment, and FIG. 2 shows a cross section of the optical modulator 23 according to this embodiment when cut at a plane perpendicular to the end face thereof (the surface of the end face shielding member 25 described later).

Figure 1:
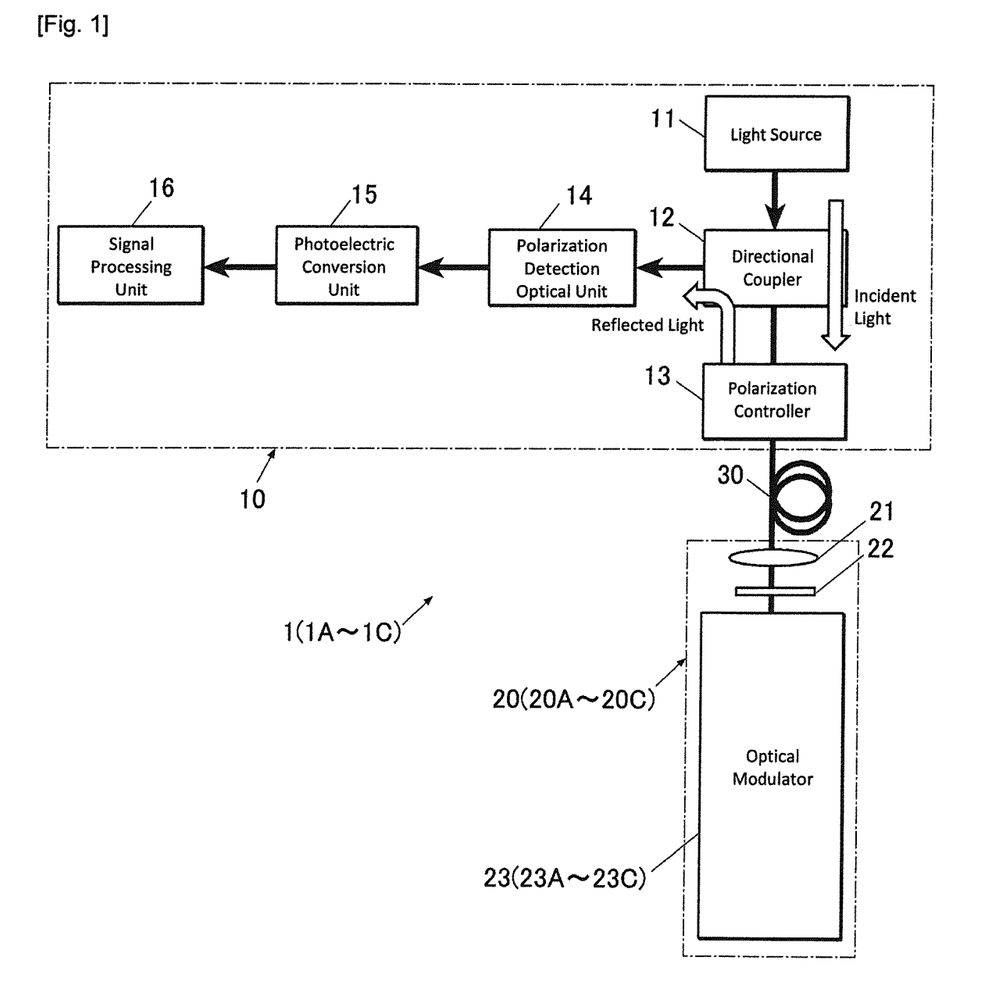
FIG. 1 This is a block diagram showing a schematic configuration of the electric field sensor according to the first to third embodiments of the present invention.

The electric field sensor 1 of this embodiment is a reflection type, and as shown in FIG. 1, comprises a laser system 10, a probe 20, and an optical fiber 30.

The laser system 10 comprises a light source 11, a directional coupler 12, a polarization controller 13, a polarization detection optical unit 14, a photoelectric conversion unit 15, a signal processing unit 16, and an output/input terminal (not shown in the figure).

The light source 11 is configured to generate and emit a laser beam L of a predetermined wavelength (for instance, when ZnTe or CdTe is used as the electro-optic crystal 24 described later, an infrared laser having a wavelength (780 nm, 850 nm, 1310 nm, 1550 nm or the like) that is longer than the wavelength corresponding to the fundamental absorption edge (energy gap)).

The directional coupler 12 is configured to output the laser beam L incoming from the light source 11 to the polarization controller 13, and output the laser beam L incoming from the polarization controller 13 to the polarization detection optical unit 14.

The polarization controller 13 is configured to adjust the polarization of the laser beam L incoming from the directional coupler 12 so as to obtain the maximum signal noise (SN) ratio, and then output the laser beam L to an output/input terminal (optical fiber 30), and is further configured to output the laser beam L incoming from the output/input terminal (optical fiber 30) to the directional coupler 12.

The polarization detection optical unit 14 is configured, when the polarization state of the laser beam L incoming from the directional coupler 12 differs from the polarization state of the laser beam L generated by the light source 11, to convert the change of the polarization into the change of the optical intensity, and output the result to the photoelectric conversion unit 15.

The photoelectric conversion unit 15 is configured to convert the optical intensity change input from the polarization detection optical unit 14 into an electric signal, and output the electric signal to the signal processing unit 16.

In other words, the polarization detection optical unit 14 and the photoelectric conversion unit 15 function as the conversion means to convert the change of the polarization of the laser beam, which passed through the optical modulator, into an electric signal.

The signal processing unit 16 comprises an amplifier, a filter and the like, and configured to extract and amplify only the intended signal among the electric signals input from the photoelectric conversion unit 15.

The probe 20 comprises a lens 21, a wavelength plate 22, an optical modulator 23, and a case (not shown in the figure) for housing these components.

A connecting port is formed on one end of the case.

The lens 21 is arranged near the connecting port of the case so that its optical axis passes through the connecting port, and is configured to refract the laser beam L incoming from the connecting port (optical fiber 30) to cause the laser beam L to travel in a state of parallel light (collimated light).

The wavelength plate 22 is arranged further inside the case than the lens 21 so that its incidence plane is orthogonal to the optical axis of the lens 21, and is configured to adjust the polarization of the laser beam L incoming from the lens 21 so that the maximum SN ratio can be obtained.

The optical modulator 23 is arranged further inside the case than the wavelength plate 22 so that its end face is orthogonal to the optical axis of the lens 21.

Figure 2:
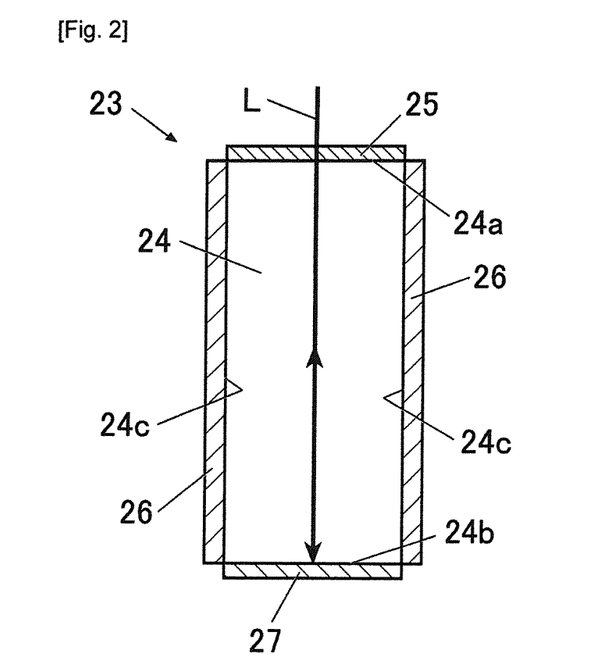
FIG. 2 This shows a cross section of the optical modulator according to the first embodiment.

The optical modulator 23 comprises, as shown in FIG. 2, an electro-optic crystal 24, an end face shielding member 25, a lateral face shielding member 26, and a mirror 27.

The electro-optic crystal 24 is configured from compound semiconductor single crystal that yields a relatively large EO effect (Pockets effect), such as zinc telluride (ZnTe) and cadmium telluride (CdTe), and is formed in a cylindrical or prismatic shape. The end faces 24a and 24b of the electro-optic crystal 24 are positioned on an extension of the principal axis of the electro-optic crystal 24, and are planes that are orthogonal to the principal axis. Moreover, the lateral face 24c of the electro-optic crystal extends in parallel to the principal axis.

The end face shielding member 25 is formed so as to cover the entire one end face 24a (incidence plane) of the electro-optic crystal 24 in a uniform coat thickness, and configured to permit the passage of only light of a specific wavelength among the lights heading toward the end face 24a; more specifically, only light of the same wavelength as the laser beam L generated by the laser system 10. In other words, the end face shielding member 25 functions as the incidence limiting means which limits the incidence of light other than the laser beam L on the incidence plane of the electro-optic crystal 24.

As methods of achieving the specific configuration of the end face shielding member 25, for instance, there are: a method of cutting an acrylic plate, which is made of polymer of acrylic acid ester or methacrylic acid ester and obtained by subjecting a low-permittivity and highly transparent amorphous synthetic resin to coloring, or a dichroic mirror, into the shape of the end face 24a, and attaching it to the end face 24a; and a method of laminating a low refractive index film made of $SiO_2$ or $Al_2O_3$ and a high refractive index film made from $TiO_2$, $ZrO_2$, $HfO_2$, or $Ta_2O_5$ on the end face 24a, and thereby configuring a dielectric multi-layer film with wavelength selectivity. The film may be formed via vapor deposition, sputtering, application of a liquid material, or any other method.

As described above, one end face 24a of the electro-optic crystal 24 is orthogonal to the principal axis and the end face shielding member 25 is uniform in thickness overall; therefore, light that enters at an angle orthogonal to the surface of the end face shielding member 25 will travel in parallel to the principal axis through the end face shielding member 25 and the electro-optic crystal 24.

The lateral face shielding member 26 is formed so as to cover the entire lateral face 24c of the electro-optic crystal 24. As described above, the lateral face 24c is parallel to the principal axis, and therefore, the lateral face shielding member 26 will extend in parallel to the principal axis. It is desirable to use a material having a high light blocking effect and low permittivity for the lateral face shielding member 26. However, because outside light is made from components of various wavelengths and components having the same wavelength as the laser beam L are minimal, the lateral face shielding member 26 can be formed from a colored acrylic plate, dichroic mirror, or dielectric multi-layer film which permits the passage of only certain light and is used in the end face shielding member 25. In particular, a colored acrylic plate is inexpensive, and it is advantageous in terms of reducing the design cost of devices. Meanwhile, a dielectric multi-layer film is advantageous in that the production process can be simplified since it can be integrally formed simultaneously with the end face shielding member 25.

The mirror 27 is used for reflecting the laser beam L, and, for example, is formed on the other end face 24b of the electro-optic crystal 24, so as to cover the entire end face 24b, and made from metals such as sliver or silver alloy, or a dielectric material with high reflectance and relatively low permittivity. As specific methods of forming the mirror 27, there are, for example, a method of vapor-depositing, plating or sputter-depositing metal on the end face 24b, and a method of shaping the metal or dielectric material into a plate shape, which is the same shape as the end face 24b, and attaching it to the end face 24b.

Because the other end face 24b of the electro-optic crystal 24 is orthogonal to the principal axis, light that travels in parallel to the principal axis in the electro-optic crystal 24 will be reflected by the mirror 27 in a direction that is 180° in reverse.

One terminal of the optical fiber 30 is connected to an output/input terminal of the laser system 10, and the other terminal is connected to a connecting port of a case of the probe 20. Through the optical fiber 30, the laser beam L incoming from the laser system 10 is output to the probe 20, and the laser beam L incoming from the probe 20 is output to the laser system 10.

(Operation of Electric Field Sensor)

In the electric field sensor 1 configured as described above, when the power switch of the laser system 10 is turned ON, a laser beam L of a predetermined wavelength is generated, and enters the probe 20 via the optical fiber 30. The laser beam L that entered the probe 20 passes through the end face shielding member 25, travels in a straight line toward the other end in parallel to the principal axis in the electro-optic crystal 24, and is then reflected with the mirror 27. The reflected laser beam L travels in a straight line parallel to the principal axis, passes through the end face shielding member 25, and is output from the probe 20. The output laser beam L enters the laser system 10 via the optical fiber 30, changes direction in the directional coupler 12, and then enters the polarization detection optical unit 14. Consequently, the electric field sensor 1 becomes possible to detect the electric field.

If an electric field is not yet working on the probe 20 in the foregoing state, the polarization state of the laser beam L output from the laser system 10 and the polarization state of the laser beam L input to the laser system 10 are equal; therefore, the polarization detection optical unit 14 is not activated, and the photoelectric conversion unit 15 does not output an electric signal.

Meanwhile, for instance, when the probe 20 in the foregoing state is placed near an electric circuit or the like during applying current, the refractive index of the electro-optic crystal 24 is changed by the electric field generated from the circuit. When the laser beam L passes through the electro-optic crystal 24 in which the refractive index was changed as described above, the polarization of the laser beam L will change. This polarization change is converted into an optical intensity change with the polarization detection optical unit 14, and then the optical intensity change is converted into an electric signal with the photoelectric conversion unit 15. At this stage, the electric signal contains noise and the electric signal itself is extremely small, but the signal processing unit 16 extracts the intended electric signal and amplifies it. The electric field that binds with the electro-optic crystal 24 is thereby detected.

In terms of structure, the case of the probe 20 has difficulty in completely preventing the infiltration of outside light due to the existence of the connecting port for the optical fiber 30 and other causes. Nevertheless, with the optical modulator 23 of this embodiment, the entire lateral face 24c of the electro-optic crystal 24 is covered with the lateral face shielding member 26, and the other end face 24b is entirely covered with the mirror 27, and the one end face 24a allows only light having the same wavelength as the laser beam L to enter due to the end face shielding member 25. Thus, in comparison to conventional optical modulators, it is possible to considerably reduce the outside light that enters the electro-optic crystal 24. Consequently, excessive carriers are not generated in the electro-optic crystal 24, and therefore it is possible to reliably detect low frequency electric fields.

Second Embodiment

The second embodiment of the present invention is now explained with reference to FIG. 1 and FIG. 3. Note that only the differences with the first embodiment will be explained.

Figure 3:
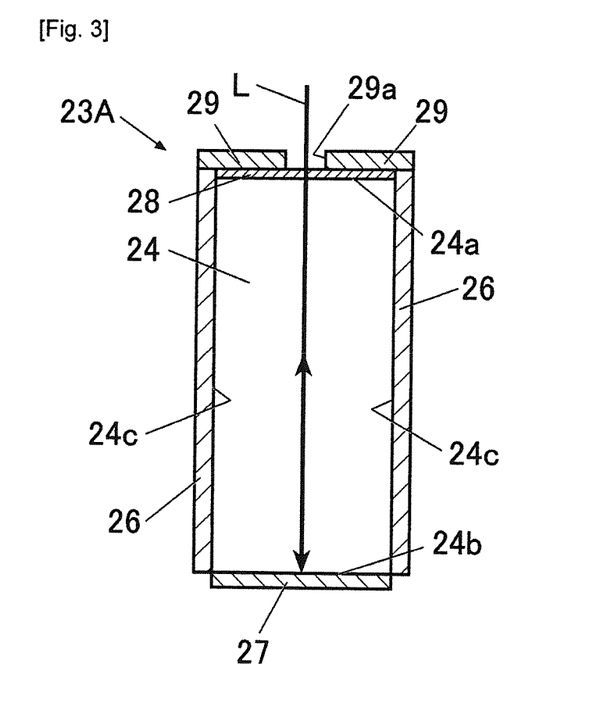
FIG. 3 This shows a cross section of the optical modulator according to the second embodiment.

FIG. 3 shows a cross section of the optical modulator 23A according to this embodiment when cut in the extending direction of the principal axis. The electric field sensor 1A of this embodiment differs from the first embodiment with regard to the structure of the one end part in the extending direction of the principal axis in the optical modulator 23A.

Specifically, the optical modulator 23 of the first embodiment comprises an end face shielding member 25, which is a dichroic mirror, on one end face 24a of the electro-optic crystal 24; however, the optical modulator 23A of this embodiment does not comprise the end face shielding member 25 as shown in FIG. 3, but the end face 24a is subject to an anti-reflection (AR) coating 28, and is additionally covered thereon with a shielding plate 29 having an outline substantially same as the end face 24a, and having a pinhole 29a formed at the central part so that the pin hole penetrates in the thickness direction of the shielding plate and has a diameter substantially equal to a width of the laser beam L that has passed through the lens 21 and the wavelength plate 22. Note that the shielding plate 29 is preferably formed from a material having low permittivity and a high light blocking effect, but it can also be formed from a colored acrylic plate, dichroic mirror, or dielectric multi-layer film which permits the passage of only certain light and is used in the end face shielding member 25 and the lateral face shielding member 26.

Because the optical modulator 23A of this embodiment is configured as described above, among the light incoming from outside the case, it is possible to block the light that does not head toward the pinhole 29a. In other words, in this embodiment, the shielding plate 29 is the incidence limiting means. Thus, in comparison to conventional optical modulators, it is possible to considerably reduce the outside light that enters the electro-optic crystal 24. Consequently, excessive carriers are not generated in the electro-optic crystal 24, and therefore it is possible to reliably detect low frequency electric fields.

Third Embodiment

The third embodiment of the present invention is now explained with reference to FIG. 1 and FIG. 4. Note that only the differences with the first embodiment will be explained.

Figure 4:
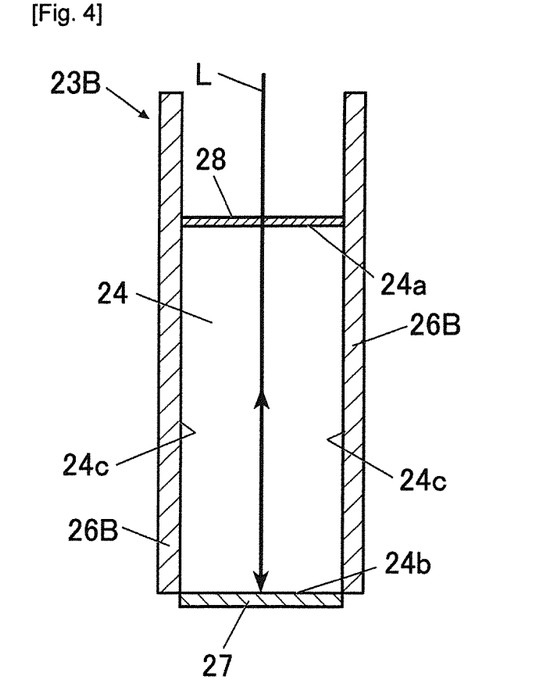
FIG. 4 This shows a cross section of the optical modulator according to the third embodiment.

FIG. 4 shows a cross section of the optical modulator 23B according to this embodiment when cut in the extending direction of the principal axis. The electric field sensor 1B of this embodiment differs from the first embodiment with regard to the structure of the one end part in the extending direction of the principal axis in the optical modulator 23B.

Specifically, the optical modulator 23 of the first embodiment comprises an end face shielding member 25 on one end face 24a of the electro-optic crystal 24; however, the optical modulator 23B of this embodiment does not comprise the end face shielding member 25 as shown in FIG. 4, but the end face 24a is subject to an AR coating 28, and one end part of the lateral face shielding member 26B is extending toward the extending direction of the principal axis (direction from which the laser beam L enters) beyond the one end face 24a.

Because the optical modulator 23B of this embodiment is configured as described above, it is possible to block outside light incoming at an angle to the extending direction of one end part of the lateral face shielding member 26B. In other words, in this embodiment, one end part (part that is not in contact with the lateral face 24c of the electro-optic crystal 24) of the lateral face shielding member 26B is the incidence limiting means. Thus, in comparison to conventional optical modulators, it is possible to considerably reduce the outside light that enters the electro-optic crystal 24. Consequently, excessive carriers are not generated in the electro-optic crystal 24, and therefore it is possible to reliably detect low frequency electric fields.

Figure 5:
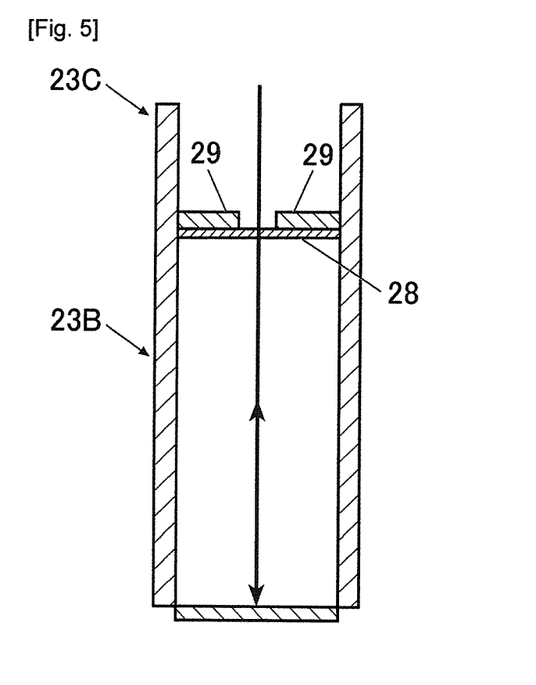
FIG. 5 This shows a cross section of the optical modulator according to a modified example of the third embodiment.

Note that, as shown in FIG. 5, the configuration may also be the optical modulator 23C in which the shielding plate 29 used in the second embodiment is attached to the surface of the AR coating 28 of the optical modulator 23B of this embodiment described above.

As a result of adopting the foregoing configuration, the outside light that enters the electro-optic crystal 24 can be reduced more than the foregoing optical modulators 23A, 23B.

Fourth Embodiment

The fourth embodiment of the present invention is now explained with reference to FIG. 6 and FIG. 7. Note that only the differences with the first embodiment will be explained.
(Configuration of Electric Field Sensor and Optical Modulator)

The schematic configuration of the electric field sensor according to this embodiment and the specific configuration of the optical modulator comprised in the electric field sensor are now explained. FIG. 6 is a block diagram showing the schematic configuration of the electric field sensor 1D according to this embodiment, and FIG. 7 shows a cross section of the optical modulator 23D according to this embodiment when cut in the extending direction of the principal axis.

Figure 6:
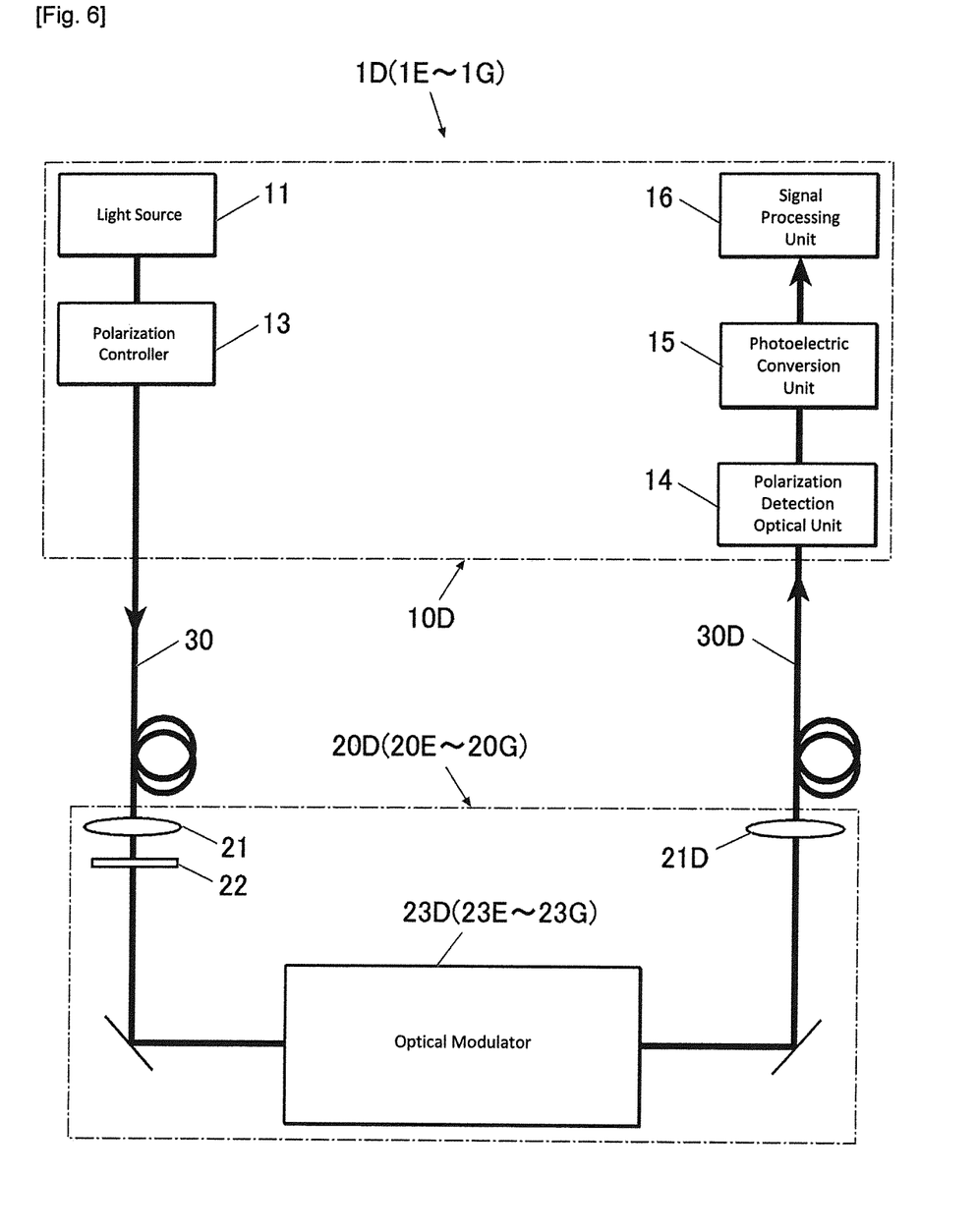
FIG. 6 This is a block diagram showing a schematic configuration of the electric field sensor according to the fourth to sixth embodiments of the present invention.

The electric field sensor 1D of this embodiment is a transmission type, and as shown in FIG. 6, comprises a laser system 10D, a probe 20D, and two optical fibers 30, 30D.

The laser system 10D of this embodiment does not have the configuration corresponding to the directional coupler of the first embodiment. Moreover, the laser system 10D of this embodiment has an output terminal and an input terminal separately.

Moreover, the polarization controller 13 of this embodiment is directly connected to the light source 11, and configured to adjust the polarization of the laser beam L incoming from the light source 11, and output the laser beam L to the output terminal.

Moreover, the polarization detection optical unit 14 of this embodiment is connected to the input terminal.

The probe 20D of this embodiment comprises two lenses 21, 21D, a wavelength plate 22, an optical modulator 23D, and a case (not shown in the figure) which houses the foregoing components.

A connecting port is formed at each end of the case.

One lens 21 out of the two lenses 21 is arranged near one connecting port of the case in the same manner as the first embodiment. Furthermore, the one lens 21 refracts the laser beam L incoming from the one connecting port (optical fiber 30) to travel in a state of parallel light.

Moreover, the other lens 21D out of the two lenses 21 is arranged near the other connecting port of the case so that its optical axis passes through the other connecting port. Furthermore, the other lens 21D refracts the laser beam L output from the other end of the optical modulator 23D to converge at the other connecting port.

Figure 7:
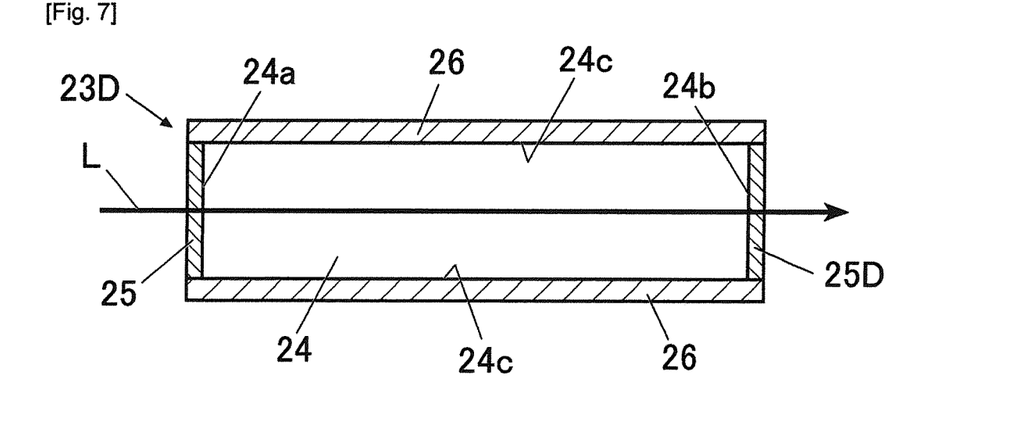
FIG. 7 This shows a cross section of the optical modulator according to the fourth embodiment.

While the optical modulator 23 of the first embodiment comprised a mirror 27 on the other end face 24b of the electro-optic crystal 24, the optical modulator 23D of this embodiment does not comprise the mirror 27 as shown in FIG. 7, and has the same configuration as the side of the one end face 24a. In other words, the optical modulator 23D of this embodiment comprises an end face shielding member 25D on the other end face 24b as with the one end face 24a.

One terminal of one optical fiber 30 out of the two optical fibers 30 is connected to the output terminal of the laser system 10D, and the other terminal is connected to one connecting port of the case of the probe 20D. Furthermore, the one optical fiber 30 is configured so that it can output the laser beam L, which was output from the laser system 10D, to the probe 20.

Moreover, one terminal of the other optical fiber 30D is connected to the other connecting port of the case of the probe 20D, and the other terminal is connected to the input terminal of the laser system 10D. Furthermore, the other optical fiber 30D is configured so that the laser beam L, which was output from the probe 20, will enter the laser system 10D.
(Operation of Electric Field Sensor)

In the electric field sensor 1D configured as described above, when the power switch of the laser system 10D is turned ON, a laser beam L of a predetermined wavelength is generated, and enters the probe 20 via the optical fiber 30. The laser beam L that entered the probe 20 passes through the end face shielding member 25 on the side of one end, and then travels in a straight line toward the other end in parallel to the principal axis in the electro-optic crystal 24. Subsequently, the laser beam L passes through the end face shielding member 25D on the side of the other end and is then output from the probe 20D. The output laser beam L enters the laser system 10D via the optical fiber 30D. Consequently, the electric field sensor 1D becomes possible to detect the electric field. The principle of detecting the electric field is the same as the first embodiment.

The case of the probe 20D has more difficulty in preventing the infiltration of outside light because it comprises more connecting ports than the first embodiment. Nevertheless, with the optical modulator 23D of this embodiment, the entire lateral face 24c of the electro-optic crystal 24 is covered with the lateral face shielding member 26, and the end faces 24a, 24b allow only light having the same wavelength as the laser beam L to enter due to the end face shielding members 25, 25D. Thus, as with the optical modulator 23 of the first embodiment, it is possible to considerably reduce the outside light that enters the electro-optic crystal 24. Consequently, excessive carriers are not generated in the electro-optic crystal 24, and therefore it is possible to reliably detect low frequency electric fields.

Fifth Embodiment

The fifth embodiment of the present invention is now explained with reference to FIG. 6 and FIG. 8. Note that only the differences with the fourth embodiment will be explained.

Figure 8:
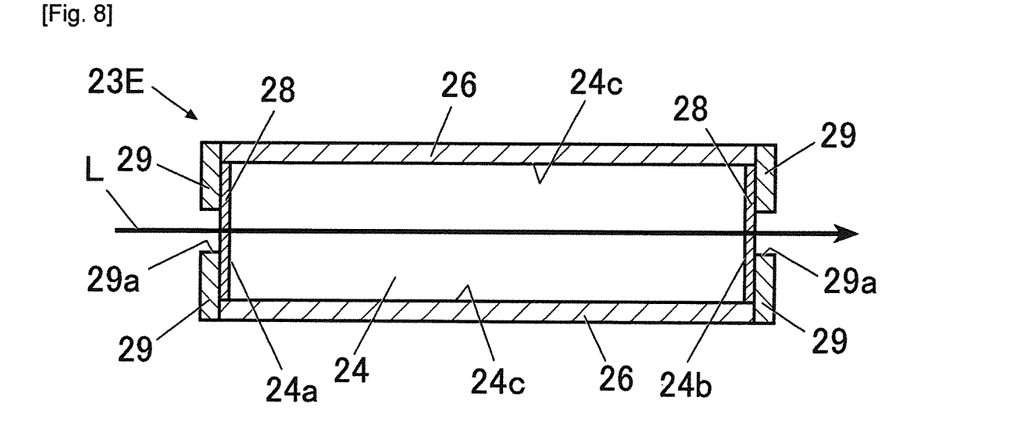
FIG. 8 This shows a cross section of the optical modulator according to the fifth embodiment.

FIG. 8 shows a cross section of the optical modulator 23E according to this embodiment when cut along the extending direction of the principal axis. The electric field sensor 1E of this embodiment differs from the fourth embodiment with regard to the structure of both ends of the optical modulator 23E in the extending direction of the principal axis.

Specifically, the optical modulator 23D of the fourth embodiment comprises end face shielding members 25, 25D on the end faces 24a, 24b of the electro-optic crystal 24, respectively; however, the optical modulator 23E of this embodiment does not comprise the face shielding members 25, 25D as shown in FIG. 8, but the respective end faces 24a, 24b are subject to an AR coating 28, and are additionally covered thereon with a shielding plate 29 having an outline substantially same as the end faces 24a, 24b, and having a pinhole 29a formed at the central part so that the pin hole penetrates in the thickness direction of the shielding plate and has a diameter substantially equal to a width of the laser beam L.

Because the optical modulator of this embodiment is configured as described above, among the light incoming from outside the case, it is possible to block the light that does not head toward the pinhole 29a. Thus, in comparison to conventional optical modulators, it is possible to considerably reduce the outside light that enters the electro-optic crystal 24. Consequently, excessive carriers are not generated in the electro-optic crystal 24, and therefore it is possible to reliably detect low frequency electric fields.

Sixth Embodiment

The sixth embodiment of the present invention is now explained with reference to FIG. 6 and FIG. 9. Note that only the differences with the fourth embodiment will be explained.

Figure 9:
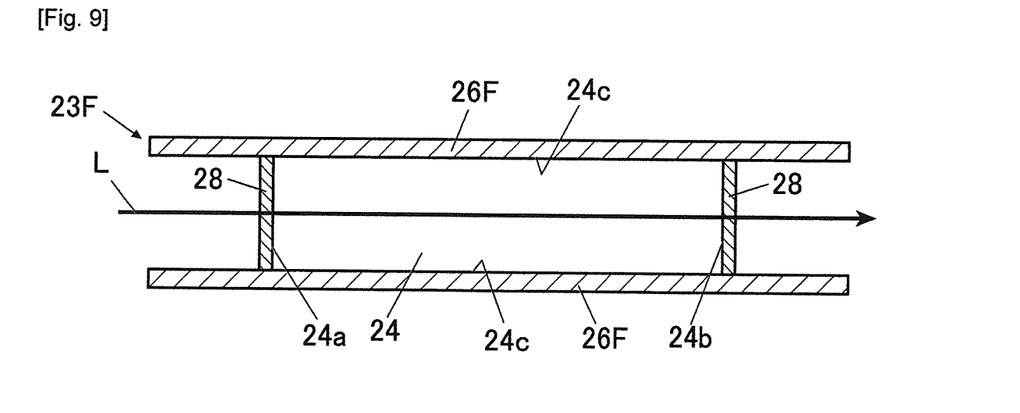
FIG. 9 This shows a cross section of the optical modulator according to the sixth embodiment.

FIG. 9 shows a cross section of the optical modulator 23F according to this embodiment when cut along the extending direction of the principal axis. The electric field sensor 1F of this embodiment differs from the fourth embodiment with regard to the structure of both ends of the optical modulator 23F in the extending direction of the principal axis.

Specifically, the optical modulator 23D of the fourth embodiment comprises an end face shielding member 25 on the end faces 24a, 24b of the electro-optic crystal 24; however, the optical modulator 23F of this embodiment does not comprise the face shielding member 25 as shown in FIG. 9, but the respective end faces 24a, 24b are subject to an AR coating 28, and both ends of the lateral face shielding member 26F of the lateral face 24c are respectively extending in the extending direction of the principal axis beyond the end faces 24a, 24b.

Because the optical modulator 23F of this embodiment is configured as described above, it is possible to block the outside light incoming at an angle to the extending direction of both ends of the lateral face shielding member 26F. Thus, in comparison to conventional optical modulators, it is possible to considerably reduce the outside light that enters the electro-optic crystal 24. Consequently, excessive carriers are not generated in the electro-optic crystal 24, and therefore it is possible to reliably detect low frequency electric fields.

Figure 10:
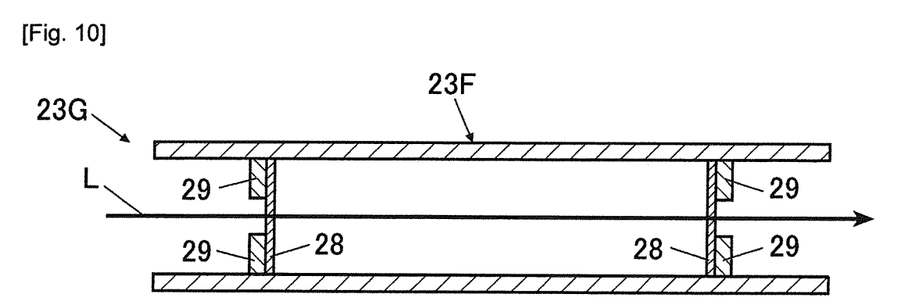
FIG. 10 This shows a cross section of the optical modulator according to a modified example of the sixth embodiment.

Note that, as shown in FIG. 10, the configuration may also be the optical modulator 23G in which the shielding plate 29 used in the fifth embodiment is attached to the surface of the AR coating 28 of the optical modulator 23F of this embodiment described above.

As a result of adopting the foregoing configuration, the outside light that enters the electro-optic crystal 24 can be reduced more than the foregoing optical modulators 23E, 23F.

While the present invention has been specifically explained based on the embodiments, the present invention is not limited to the foregoing embodiments, and can be modified so as long as such modification does not deviate from the gist of this invention.

For example, in the foregoing embodiments, a case of using the optical modulator in an electric field sensor was explained, but the present invention can also be applied to overall optical devices that use the EO effect.

Moreover, in the first and fourth embodiments, the lateral face shielding members 26B, 26F, in which the ends are extended as in the third and sixth embodiments, may be used concurrently.

REFERENCE SIGNS LIST 1, 1A to 1F Electric field sensor
10, 10D Laser system
11 Light source
12 Directional coupler
13 Polarization controller
14 Polarization detection optical unit
15 Photoelectric conversion unit
16 Signal processing unit
20, 20D Probe
21, 21D Lens
22 Wavelength plate
23, 23A to 23G Optical modulator
24 Electro-optic crystal (compound semiconductor single crystal)
24a One end face (incidence plane)
24b Other end face
24c Lateral face
25, 25D End face shielding member (incidence limiting means)
26 Lateral face shielding member (shielding member)

26B, 26F Lateral face shielding member (incidence limiting means)
27 Mirror
28 AR coating
29 Shielding plate (incidence limiting means)
29a Pinhole
30, 30D Optical fiber
L Laser beam

The invention claimed is:

1. An optical modulator capable of modulating incident laser beam by a compound semiconductor single crystal having a property of generating an electro-optic effect, the optical modulator comprising:
    incidence limiting means which is provided on or near an incidence plane, on which the laser beam can be incident, of the compound semiconductor single crystal so as to limit incidence of light other than the laser beam on the incidence plane; and
    a shielding member which is formed from a low-permittivity material having a light blocking effect, and covers a surface of the compound semiconductor single crystal that extends along a traveling direction of the laser beam that entered the compound semiconductor single crystal;
    wherein the incidence limiting means is configured such that the shielding member extends beyond the incidence plane in a direction from which the laser beam enters.

2. The optical modulator according to claim 1, wherein the incidence limiting means is a dichroic mirror which is configured to permit the passage of only light of the same wavelength as the laser beam, and is attached to the incidence plane.

3. The optical modulator according to claim 1, wherein the incidence limiting means is a shielding plate in which a pinhole penetrating in a thickness direction and having a diameter substantially equal to a width of the laser beam is formed, and which is attached to the incidence plane.

4. The optical modulator according to claim 1, wherein an antireflection film which prevents the laser beam from reflecting off the incidence plane is formed between the incidence plane and the incidence limiting means.

5. An electric field sensor, comprising:
    the optical modulator according to claim 1;
    a light source to cause a laser beam to be incident on the incidence plane; and
    conversion means to convert changes in polarization of the laser beam that passed through the optical modulator, into an electric signal.

6. The electric field sensor according to claim 5, wherein the incidence limiting means of the optical modulator is a dichroic mirror which is configured to permit the passage of only light of the same wavelength as the laser beam, and is attached to the incidence plane.

7. The electric field sensor according to claim 5, wherein the incidence limiting means of the optical modulator is a shielding plate in which a pinhole penetrating in a thickness direction and having a diameter substantially equal to a width of the laser beam is formed, and which is attached to the incidence plane.

8. The electric field sensor according to claim 6, wherein an antireflection film which prevents the laser beam from reflecting off the incidence plane is formed between the incidence plane and the incidence limiting means.

9. The electric field sensor according to claim 7, wherein an antireflection film which prevents the laser beam from reflecting off the incidence plane is formed between the incidence plane and the incidence limiting means.

10. The optical modulator according to claim 3, wherein an antireflection film which prevents the laser beam from reflecting off the incidence plane is formed between the incidence plane and the incidence limiting means.

11. An optical modulator capable of modulating incident laser beam by a compound semiconductor single crystal having a property of generating an electro-optic effect, the optical modulator comprising:
    incidence limiting means which is provided on or near an incidence plane, on which the laser beam can be incident, of the compound semiconductor single crystal so as to limit incidence of light other than the laser beam on the incidence plane, the incidence limiting means being a shielding plate in which a pinhole penetrating in a thickness direction and having a diameter substantially equal to a width of the laser beam is formed, and which is attached to the incidence plane;
    an antireflection film which prevents the laser beam from reflecting off the incidence plane being formed between the incidence plane and the incidence limiting means; and
    a shielding member which is formed from a low-permittivity material having a light blocking effect, and covers a surface of the compound semiconductor single crystal that extends along a traveling direction of the laser beam that entered the compound semiconductor single crystal.

12. An electric field sensor, comprising:
    the optical modulator according to claim 11;
    a light source to cause a laser beam to be incident on the incidence plane; and
    conversion means to convert changes in polarization of the laser beam that passed through the optical modulator, into an electric signal.

* * * * *